US 6,729,261 B2

(12) United States Patent
Hongo

(10) Patent No.: US 6,729,261 B2
(45) Date of Patent: May 4, 2004

(54) PLASMA PROCESSING APPARATUS

(75) Inventor: Toshiaki Hongo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 111 days.

(21) Appl. No.: 09/982,784

(22) Filed: Oct. 22, 2001

(65) Prior Publication Data
US 2002/0046807 A1 Apr. 25, 2002

(30) Foreign Application Priority Data
Oct. 23, 2000 (JP) ........................................ 2000-322096

(51) Int. Cl.⁷ ............................. C23C 16/00; H05H 1/00
(52) U.S. Cl. ....................... 118/723 MW; 118/724; 156/345.41; 156/345.37
(58) Field of Search ................. 118/723 MW, 118/723 ME, 723 MR, 723 AN, 724; 156/345.41, 345.42, 345.36, 345.37; 315/111.21

(56) References Cited
U.S. PATENT DOCUMENTS 5,545,258 A * 8/1996 Katayama et al. ..... 118/723 MP
5,645,644 A * 7/1997 Mabuchi et al. ..... 118/723 MW
5,914,051 A * 6/1999 Kanai et al. ................... 216/69
6,059,922 A * 5/2000 Yamazaki et al. ...... 156/345.37

FOREIGN PATENT DOCUMENTS

| JP | 3-191073 | 8/1991 |
| JP | 5-343334 | 12/1993 |
| JP | 9-181052 | 7/1997 |
| JP | 11-339997 A | * 12/1999 | ............ H05H/1/46 |

* cited by examiner

Primary Examiner—Parviz Hassanzadeh
(74) Attorney, Agent, or Firm—Finnegan, Henderson, Farabow, Garrett & Dunner, LLP

(57) ABSTRACT

A plasma processing apparatus includes, in order to efficiently cool an insulating plate having a relatively low thermal conductivity, a process chamber, the insulating plate divided into a plurality of regions and attached airtightly to the ceiling of the process chamber, a planar antenna member placed above the insulating plate and including microwave radiation holes for transmitting therethrough microwave used for generating plasma, and a support frame member supporting the insulating plate divided into a plurality of regions and including a heat medium path for flowing a heat medium along a line by which the insulating plate is divided into a plurality of regions and along a peripheral part of the insulating plate.

14 Claims, 7 Drawing Sheets

PLASMA PROCESSING APPARATUS

BACKGROUND OF THE INVENTION

1. Field of the Invention

The present invention relates to a plasma processing apparatus used for processing semiconductor wafers and the like by the action of a plasma generated by microwave.

2. Description of the Background Art

In recent years, semiconductor products have been increased in density and reduced in size to a great degree. Accordingly, some manufacturing processes of the semiconductor products employ a plasma processing apparatus for such processing as film deposition, etching and ashing. In particular, there is a tendency to use a microwave plasma apparatus since the microwave plasma apparatus can produce a plasma in a stable manner even in a high-vacuum state of a relatively low pressure, specifically from about 0.1 to several tens of mTorr, by using the microwave or a combination of the microwave and a magnetic field from a ring-shaped coil to produce a high-density plasma.

Such a microwave plasma processing apparatus is disclosed for example in Japanese Patent Laying-Open Nos. 3-191073 and 5-343334 and Japanese Patent Laying-Open No. 9-181052 filed by the applicant of the present application. A general plasma processing apparatus using the microwave is described briefly below in conjunction with FIGS. 9 and 10. FIG. 9 shows a structure of a conventional and generally employed plasma processing apparatus and FIG. 10 is a plan view of a planar antenna member.

Referring to FIG. 9, a plasma processing apparatus 2 includes a process chamber 4 which can be evacuated, a mount base 6 on which a semiconductor wafer W is mounted, and an insulating plate 8 provided in an airtight manner on a ceiling opposite to mount base 6. Insulating plate 8 transmitting microwave is formed of aluminum nitride or the like in the shape of a disk, for example.

Plasma processing apparatus 2 further includes, on the upper side of insulating plate 8, a planar antenna member 10 in the shape of a disk with a thickness of several millimeters as shown in FIG. 10 and a wave-delay member 12 formed of a dielectric for example for decreasing the wavelength of microwave in the radial direction of planar antenna member 10 as required. In addition, plasma processing apparatus 2 includes a ceiling cooling jacket 16 above wave-delay member 12 that has a cooling channel 14 formed for flowing a cooling water therein in order to cool wave-delay member 12 and the like. Antenna member 10 includes a great number of microwave radiation holes 18 that are through holes nearly circular in shape. In general, microwave radiation holes 18 are arranged concentrically as shown in FIG. 10 or spirally. An internal cable 22 of a coaxial waveguide 20 is connected to the central part of planar antenna member 10 for guiding a microwave of 2.45 GHz for example produced by a microwave generator (not shown). The microwave is transmitted radially in the radial direction of antenna member 10 and also discharged from microwave radiation holes 18 provided in antenna member 10 to be transmitted downward through insulating plate 8 into process chamber 4. The microwave causes a plasma in process chamber 4 for performing a predetermined plasma process such as etching and film deposition for a semiconductor wafer.

Insulating plate 8 demarcating the ceiling of process chamber 4 is made of aluminum nitride (AlN) having in general a relatively low dielectric loss. However, heat is still generated due to the dielectric loss so that much of the microwave power is wastefully consumed as the dielectric loss, and consequently, the energy efficiency deteriorates. Moreover, even if insulating plate 8 is made of any material of lower dielectric loss, heat generation inevitably occurs due to the dielectric loss. Those materials constituting insulating plate 8 have a relatively low thermal conductivity and thus the generated heat remains in insulating plate 8 without being dissipated sufficiently to the sidewall of process chamber 4. Accordingly, the temperature of the heat remaining in insulating plate 8 excessively rises, which results in a problem that the temperature distribution of semiconductor wafer W placed adjacent to insulating plate 8 is adversely affected.

SUMMARY OF THE INVENTION

One object of the present invention is to provide a plasma processing apparatus capable of efficiently cooling an insulating plate having a relatively low thermal conductivity.

A plasma processing apparatus according to one aspect of the present invention includes a process chamber including an opened ceiling and an internal space which can be evacuated, an insulating plate divided into a plurality of regions and airtightly attached to the ceiling of the process chamber, a mount base placed in the process chamber for mounting thereon a workpiece to be processed, a planar antenna member placed above the insulating plate and including a microwave radiation hole for transmitting therethrough microwave used for generating plasma, the microwave transmitted through the insulating plate into the process chamber, gas supply means for supplying a predetermined gas into the process chamber, and a heat medium path for flowing a heat medium along a line by which the insulating plate is divided into a plurality of regions.

With the structure as detailed above, the heat medium flowing through the heat medium path can be used to control the temperature of the insulating plate. Prevention is thus possible of a thermally adverse influence on a workpiece to be processed.

The plasma processing apparatus may further include a ring-shaped heat medium path for flowing the heat medium along a peripheral part of the insulating plate so as to facilitate the temperature control of the insulating plate.

Preferably, the plasma processing apparatus further includes heat medium temperature control means for controlling the temperature of the heat medium. The heat medium temperature control means controls the temperature of the heat medium to render the temperature of the insulating plate substantially constant in a normal process. The heat medium temperature control means controls the temperature of the heat medium to heat the insulating plate to at least a predetermined temperature in cleaning.

The insulating plate is formed of any ceramic material such as aluminum nitride and alumina, or quartz, for example. The insulating plate is divided substantially radially from a central part of the insulating plate.

Preferably, the heat medium path and the microwave radiation holes of the planar antenna member are displaced from each other with respect to the direction in which the microwave is transmitted. Then, it never occurs that the microwave from the microwave radiation holes is radiated onto and absorbed by the heat medium path. The microwave can thus be supplied efficiently into the process chamber.

When the plasma processing apparatus includes the ring-shaped heat medium path in addition to the heat medium path, the ring-shaped heat medium path and the microwave radiation holes of the planar antenna member may be displaced from each other with respect to the direction in which the microwave is transmitted.

According to one embodiment of the present invention, the plasma processing apparatus further includes a support frame member supporting the insulating plate divided into a plurality of regions, and the support frame member includes the heat medium path. The support frame member may include the heat medium path and the ring-shaped heat medium path. Preferably, in order to efficiently supply the microwave into the process chamber, the support frame member and the microwave radiation holes of the planar antenna member are displaced from each other with respect to the direction in which the microwave is transmitted.

Preferably, the plasma processing apparatus further includes first sealing means for airtightly sealing between the insulating plate and the support frame member and second sealing means for airtightly sealing between the support frame member and the process chamber.

According to another aspect of the present invention, a plasma processing apparatus includes a process chamber including an opened ceiling and an internal space which can be evacuated, an insulating plate divided into a plurality of regions and airtightly attached to the ceiling of the process chamber, a mount base placed in the process chamber for mounting thereon a workpiece to be processed, a planar antenna member placed above the insulating plate and including a plurality of microwave radiation holes for transmitting therethrough microwave used for generating plasma, the microwave transmitted through the insulating plate into the process chamber, gas supply means for supplying a predetermined gas into the process chamber, and a support frame member supporting the insulating plate divided into a plurality of regions and including a heat medium path for flowing a heat medium along a line by which the insulating plate is divided into a plurality of regions and along a peripheral part of the insulating plate.

In the plasma processing apparatus with the structure detailed above, the heat medium flowing though the heat medium path formed in the support frame member facilitates the temperature control of the insulating plate. For example, for a process requiring the uniformity of the planar temperature of a workpiece to be processed, a heat medium kept at a low temperature can be flown to cool the insulating plate and thus always keep the insulating plate at a constant temperature, so that a thermally adverse influence on the workpiece can be prevented. For cleaning, a heat medium maintained at a high temperature can be flown to heat the insulating plate and thus enhance the cleaning efficiency.

Preferably, the support frame member and the microwave radiation holes of the planar antenna member are displaced from each other with respect to the direction in which the microwave is transmitted. Then, it never occurs that the microwave from the microwave radiation holes is radiated onto and absorbed by the support frame member and accordingly the microwave can efficiently be supplied into the process chamber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
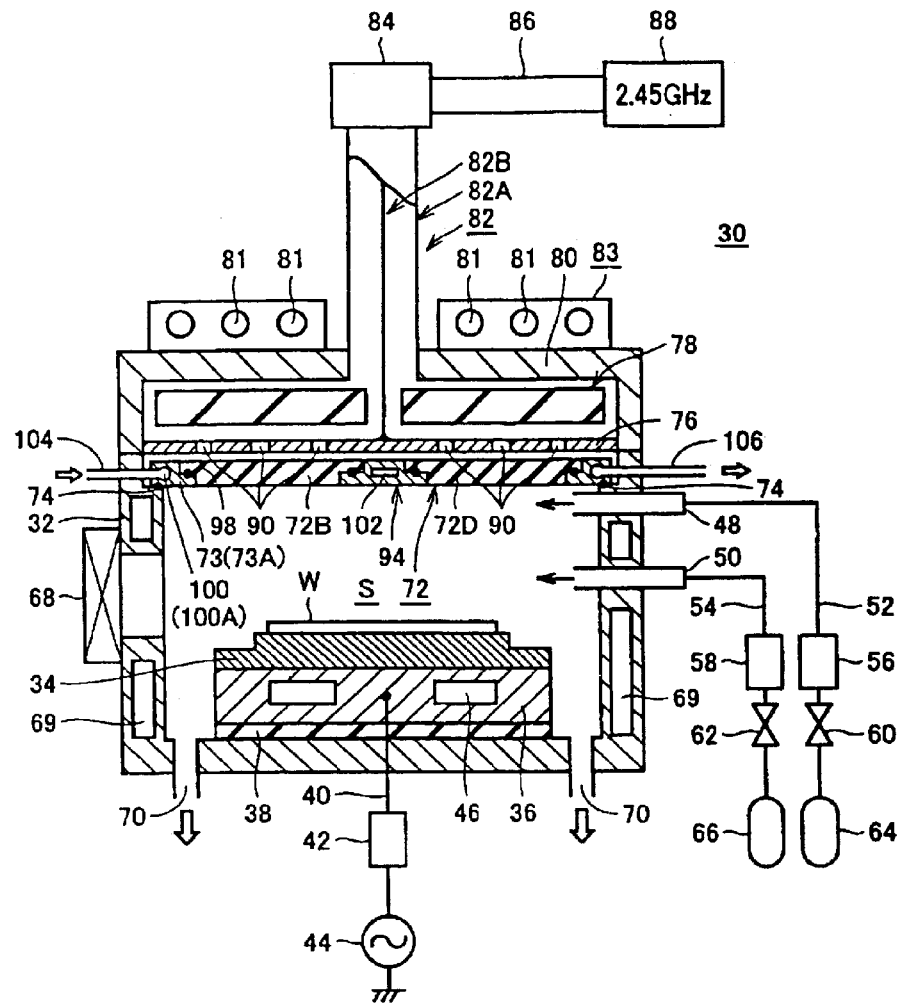
FIG. 1 diagrammatically shows a cross section of a plasma processing apparatus as an example according to one embodiment of the present invention.

A plasma processing apparatus according to one embodiment of the present invention is now described in detail in conjunction with attached drawings.

According to this embodiment, the plasma processing apparatus is applied to plasma CVD (Chemical Vapor Deposition) processing and accordingly explained. As shown, this plasma processing apparatus 30 includes a process chamber 32 formed entirely in a tubular shape with its sidewall and bottom formed of a conductor such as aluminum, for example. The inside of process chamber 32 is constituted of a sealed process space S.

In process chamber 32, a mount base 34 is housed on which a semiconductor wafer W for example is mounted as a workpiece to be processed. Mount base 34 made of anodized aluminum for example is nearly cylindrical in shape with a flat protrusion. The bottom of mount base 34 is supported by a support base 36 also made of aluminum for example and formed in the shape of a cylinder. Support base 36 is placed within process chamber 32 on the bottom thereof via an insulating member 38.

On the upper side of mount base 34, an electrostatic chuck or clamping mechanism (not shown) is provided for holding a wafer. Mount base 34 is connected, via a feeder line 40, to a matching box 42 and a high-frequency power source 44 for bias of 13.56 MHz for example. In some cases, high-frequency bias power source 44 may not be provided.

Support base 36 supporting mount base 34 includes a cooling jacket 46 where a cooling water flows for cooling a wafer being subjected to plasma processing. As required, a heater may be provided in mount base 34.

The sidewall of process chamber 32 is provided with a plasma gas supply nozzle 48 formed of a quartz pipe for supplying a plasma gas such as argon gas for example into the chamber as well as a process gas supply nozzle 50 formed of a quartz pipe for example for supplying a process gas such as deposition gas for example. These nozzles 48 and 50 are connected respectively to a plasma gas source 64 and a process gas source 66 by respective gas supply paths 52 and 54 via mass-flow controllers 56 and 58 and open-close valves 60 and 62. A deposition gas such as $SiH_4$, $O_2$ and $N_2$ for example may be used as the process gas.

Moreover, a gate valve 68 is provided on the periphery of the sidewall of the chamber 32 that opens and closes when a wafer is transported into or out of the chamber, and a cooling jacket 69 is further provided for cooling the sidewall. An exhaust outlet 70 is provided to the bottom of process chamber 32 that is connected to a vacuum pump (not shown) in order to evacuate the inside of process chamber 32 as required to a predetermined pressure.

The ceiling of process chamber 32 is opened where an insulating plate 72 is provided, supported by a support frame member 73, in an airtight manner via a sealing member 74 such as O-ring. Insulating plate 72 characterizing the present invention that transmits microwave is made of a ceramic material such as AlN for example with a thickness of approximately 20 mm.

Above insulating plate 72, a disk-shaped planar antenna member 76 and a wave-delay member 78 having a high-permittivity property are provided. Specifically, planar antenna member 76 is formed to constitute a bottom plate of a waveguide box 80 formed of a hollow cylindrical vessel shaped to be integrated with process chamber 32. Planar antenna member 76 is provided opposite mount base 34 within process chamber 32.

An outer tube 82A of a coaxial waveguide 82 is connected to the center in the upper portion of waveguide box 80, and an internal cable 82B within waveguide 82 is connected to the central part of planar antenna member 76. Coaxial waveguide 82 is connected to a microwave generator 88 of 2.45 GHz for example via a mode converter 84 and a waveguide 86, for transmitting microwave to planar antenna member 76. The frequency is not limited to 2.45 GHz and another frequency, 8.35 GHz for example, may be used. As the waveguide, a waveguide having a circular or rectangular cross section or coaxial waveguide may be employed. According to this embodiment, the coaxial waveguide is used. On the upper side of waveguide box 80, a ceiling cooling jacket 83 is provided having a cooling channel 81 formed therein for flowing a cooling water and accordingly cooling wave-delay member 78. As wave-delay member 78 having the high-permittivity property is provided within waveguide box 80 and on the upper side of planar antenna member 76, the guide wavelength of microwave is decreased by the wavelength-shortening effect of wave-delay member 78. Aluminum nitride for example may be used as wave-delay member 78.

Figure 3:
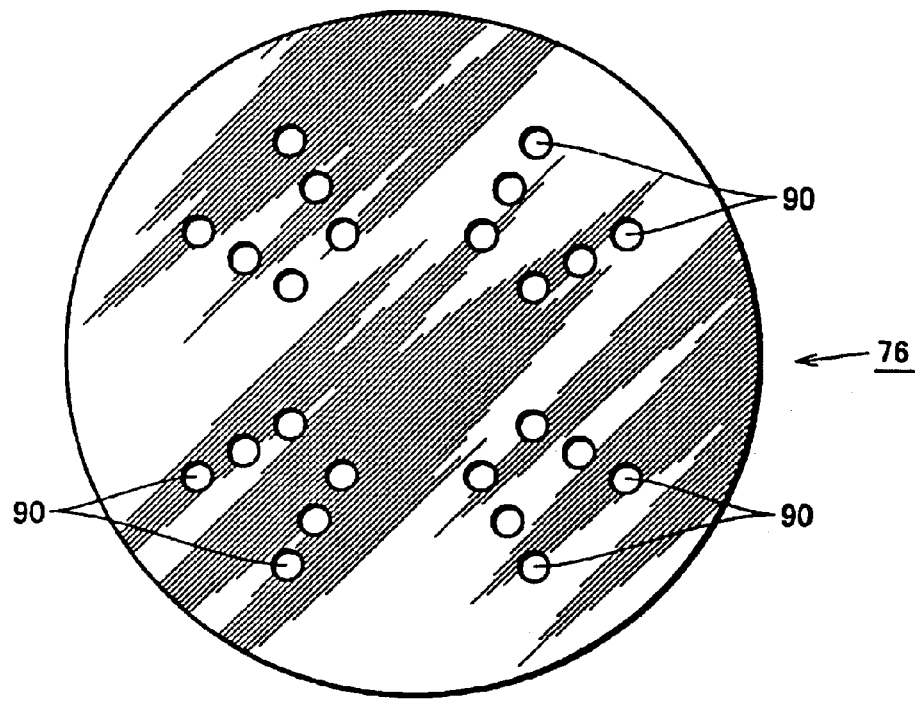
FIG. 3 is a plan view of a planar antenna member as an example.

When planar antenna member 76 is applied to an 8-inch wafer, planar antenna member 76 is formed of a disk made of a conductive material with a diameter from 30 to 40 mm and a thickness from 1 to several millimeters, particularly 5 mm for example. Specifically, planar antenna member 76 is formed for example of a copper plate or aluminum plate with its surface plated with silver. As shown in FIG. 3, this disk has a great number of microwave radiation holes 90 formed of through holes each in the shape of a circle for example. Radiation holes 90 are almost uniformly arranged over antenna member 76 except for a part of the entire region. The arrangement of microwave radiation holes 90 is not particularly limited. For example, microwave radiation holes 90 may concentrically, spirally or radially arranged for example. In addition, the shape of microwave radiation holes 90 is not limited to the circle. For example, the microwave radiation holes may be in the shape of an elongated slit. The slit-shaped radiation holes paired to form the shape of T with a gap may be arranged. Here, microwave radiation holes 90 are formed to be displaced from support frame member 73 supporting insulating plate 72 as explained below.

A detailed description is given here concerning insulating plate 72 and support frame member 73 supporting insulating plate 72.

Figure 4:
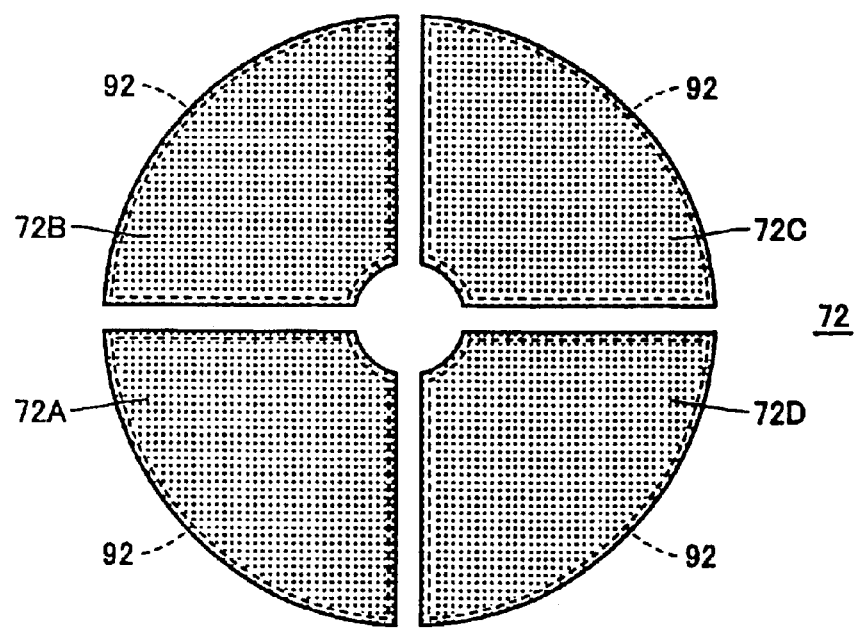
FIG. 4 is a plan view of an insulating plate divided into four sections.

As shown in FIG. 4, insulating plate 72 is divided substantially radially, from the center of process chamber 32, into a plurality of sections, namely into four sector-shaped sections 72A, 72B, 72C and 72D. Sections 72A–72D each have an engaging step 92 (see FIG. 2), located along the entire periphery on the bottom side thereof, and having a cross section with a substantially right angle. Sections 72A–72D are each made of a material through which microwave can be transmitted, for example, ceramic material such as aluminum nitride and alumina, or quartz ($SiO_2$), for example. In this case, for cooling for example of sections 72A–72D as described below, these sections are preferably made of a material with a good thermal conductivity, for example, aluminum nitride.

Figure 2:
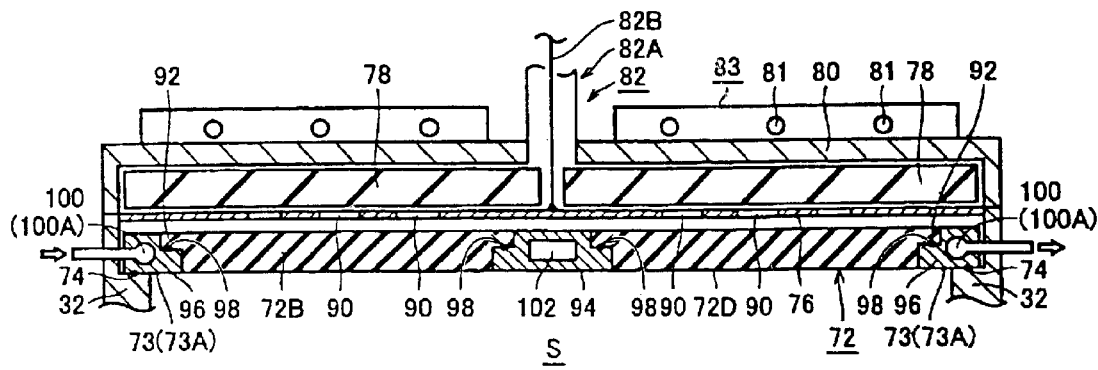
FIG. 2 is a partially enlarged view of the plasma processing apparatus shown in FIG. 1.
Figure 5:
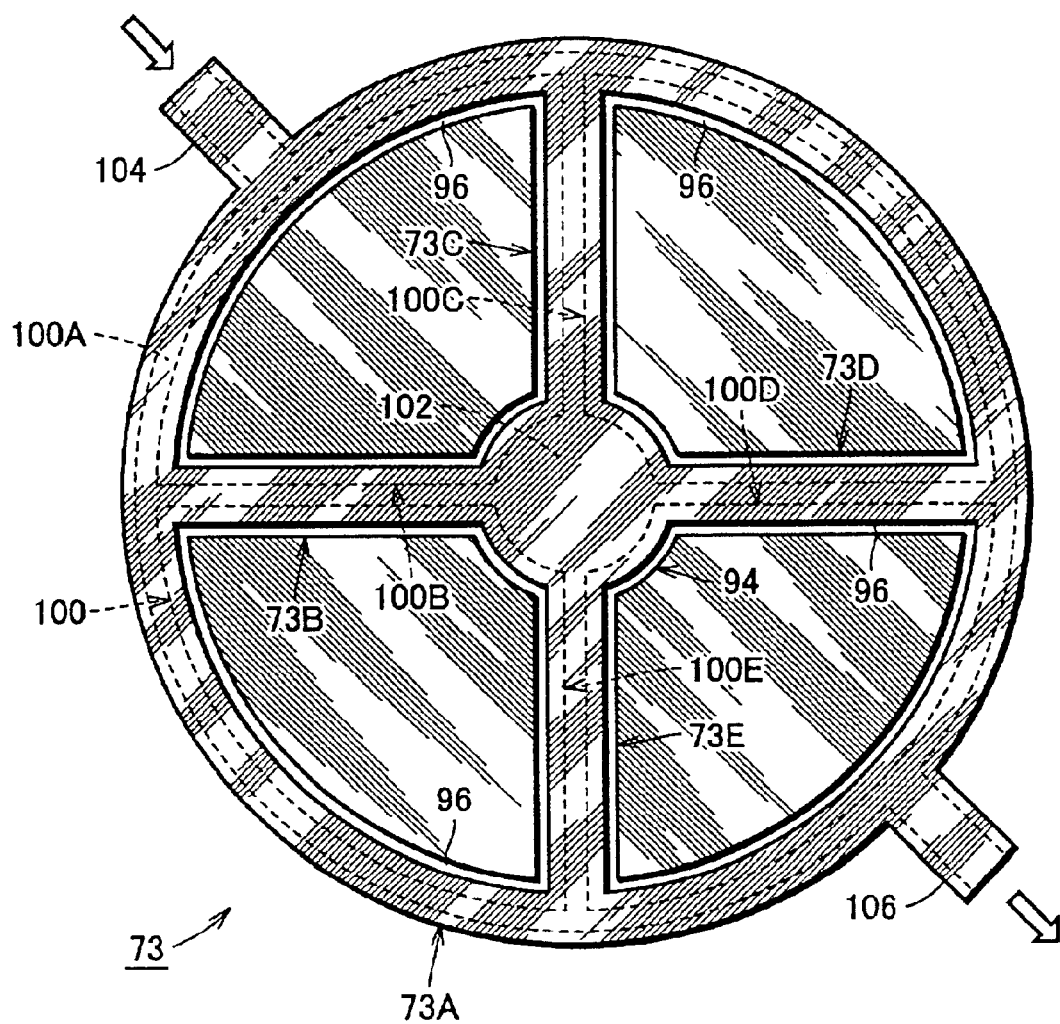
FIG. 5 is a plan view of a support frame member for supporting the insulating plate.
Figure 6:
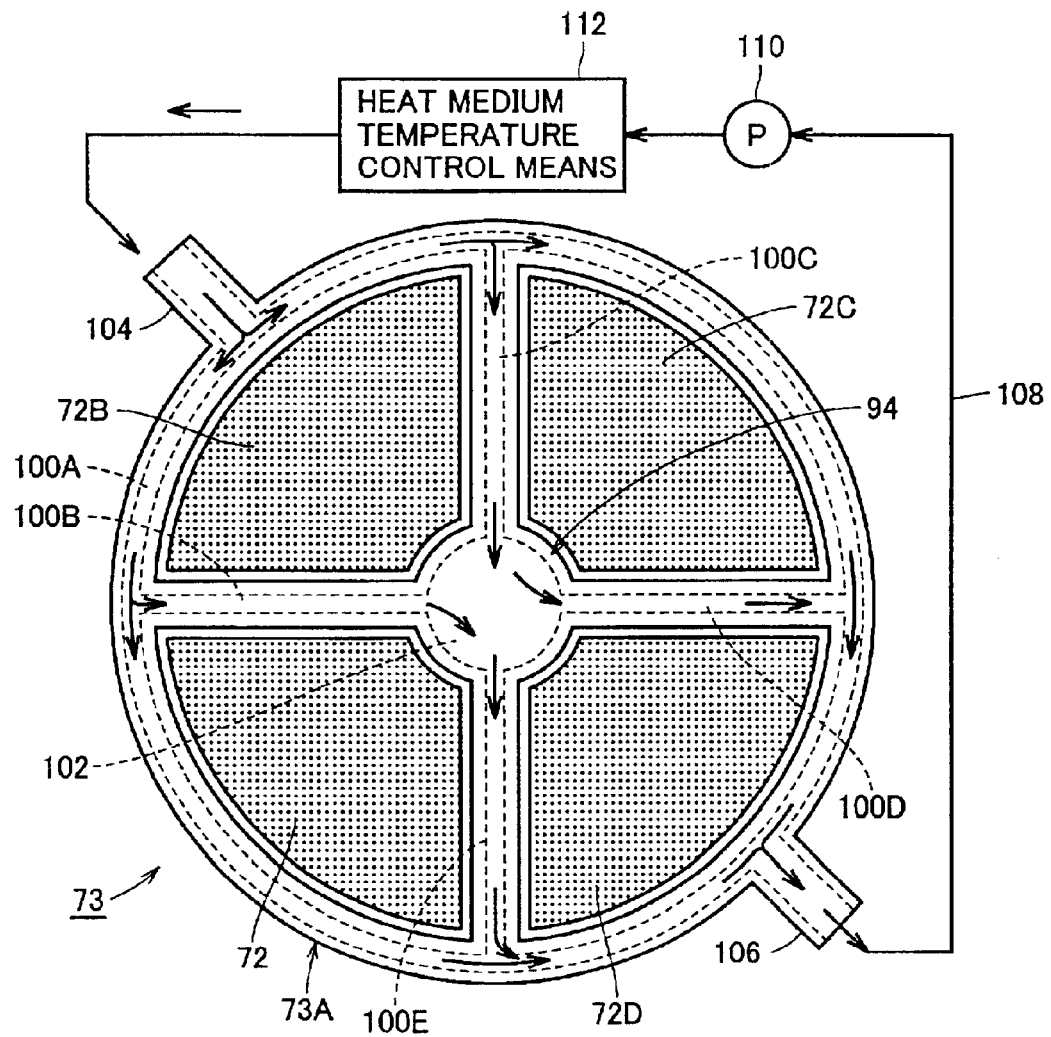
FIG. 6 is a plan view of the support frame member supporting the insulating plate.

Sections 72A–72D are supported by support frame member 73. Support frame member 73 is made of a material having a good thermal conductivity and never causing metallic contamination for semiconductor wafer W to be processed, for example, aluminum. Specifically, support frame member 73 is constituted of, as shown in FIG. 5, a ring-shaped peripheral frame 73A provided along the perimeter of the opening of the ceiling of process chamber 32, and four internal frames 73B, 73C, 73D and 73E provided inside ring-shaped peripheral frame 73A and connected to form the shape of a cross. At the center of cross-shaped internal frames 73B–73E, a circular connection part 94 is formed. Then, as shown in FIG. 6, sections 72A–72D are fit in and supported in respective portions enclosed by ring-shaped frame 73A and internal frames 73B–73E. Accordingly, a supporting step 96 having a cross section with a substantially right angle is formed on the upper plane of the inner periphery of ring-shaped peripheral frame 73A, on the upper plane on both sides of each of internal frames 73B–73E, and on the upper periphery of connection part 94. Then, as shown in FIG. 2, the lower plane of engaging step 92 of sections 72A–72D is supported, via a sealing member 98 such as O-ring, on the upper plane of supporting step 96 being in contact with engaging step 92. In this way, the opening of the ceiling of process chamber 32 is airtightly sealed.

Support frame member 73 has a heat medium path 100 formed therein. Specifically, as shown in FIG. 5, heat medium path 100 includes a ring-shaped path 100A formed inside and along ring-shaped peripheral frame 73A, and cross-shaped paths 110B–100E formed along and inside cross-shaped internal frames 73B–73E. These paths 100A and 100B–100E communicate with each other. At connection part 94, a confluence space 102 is formed where cross-shaped paths 100B–100E are coupled.

A medium inlet 104 for providing a heat medium therethrough is formed at a part of ring-shaped peripheral frame 73A and a medium outlet 106 is formed opposite medium inlet 104 with respect to the center of ring-shaped peripheral frame 73A. In addition, as shown in FIG. 6, a circulation path 108 is provided for communication between medium inlet 104 and medium outlet 106. In communication path 108, a circulation pump 110 for forcing the heat medium to circulate as well as heat medium temperature control means 112 for controlling the temperature of the circulated heat medium are provided.

Figure 7:
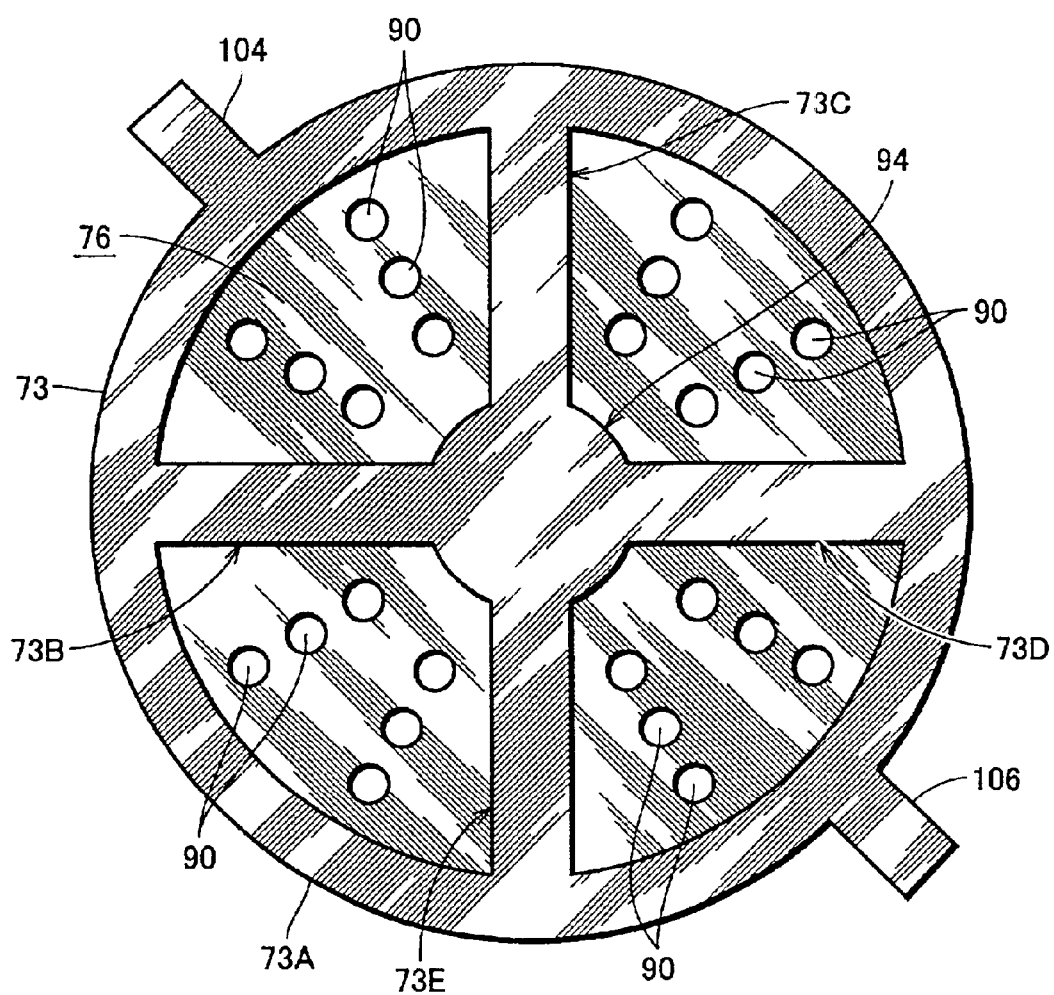
FIG. 7 is a bottom view of the support frame member and the planar antenna member illustrating the positional relation therebetween.

FIG. 7 shows support frame member 73 and planar antenna member 76 viewed from the bottom thereof for illustrating a positional relation therebetween (the sections of the insulating plate are not shown). Planar antenna member 76 has its microwave radiation holes 90 arranged not to match in position with support frame member 73 with respect to the direction in which microwave is transmitted (the direction perpendicular to the plane of the drawing). In other words, microwave radiation holes 90 and support frame member 73 are arranged not to overlap each other in order to prevent the microwave transmitted through insulating plate 72 from being absorbed by support frame member 73 made of aluminum.

A processing method applied to the plasma processing apparatus structured as explained above is described below.

Semiconductor wafer W is first placed in process chamber 32 by a transport arm (not shown) via gate valve 68, and a lifter bin (not shown) is moved up and down to set wafer W on a mount plane on the upper side of mount base 34.

Then, the inside of process chamber 32 is maintained at a predetermined process pressure, for example, in the range from 0.01 to several pascals. Argon gas for example is supplied from plasma gas supply nozzle 48 at a controlled flow rate while deposition gas such as $SiH_4$, $O_2$ and $N_2$ for example is supplied from process gas supply nozzle 50 at a controlled flow rate. Simultaneously, microwave from microwave generator 88 is supplied via waveguide 86 and coaxial waveguide 82 to planar antenna member 76 so as to provide the microwave with the wavelength shortened by wave-delay member 78 into process space S. Plasma is thus generated to carry out a predetermined plasma process, for example, a film deposition process by plasma CVD.

The microwave of 2.45 GHz for example produced by microwave generator 88 is mode-converted into TEM mode for example, and then propagated within coaxial waveguide 82 to reach planar antenna member 76 in waveguide box 80. The microwave is then propagated from the central part, which is connected to internal cable 82B, radially to the peripheral part of disk-shaped antenna member 76, while the microwave is transmitted through microwave radiation holes 90 and insulating plate 72 to be supplied into process space S directly below antenna member 76. Here, a great number of circular microwave radiation holes 90 are formed and arranged concentrically or spirally and almost uniformly over planar antenna member 76.

The microwave excites the argon gas to generate plasma which diffuses downward. The process gas is accordingly activated to generate an active seed. By the action of the active seed, the surface of wafer W is processed, for example, plasma CVD-processed.

It is unavoidable that, when the microwave is transmitted through insulating plate 72, 30% for example of the microwave power is consumed due to the dielectric loss at this portion and accordingly heat generation occurs. In addition, plasma heat, radiant heat and the like cause insulating plate 72 to be heated. If the heat generation is left as it is, the temperature of insulating plate 72 itself gradually increases which could have a thermally adverse influence on semiconductor wafer W being processed. According to this embodiment, insulating plate 72 is appropriately cooled by allowing a heat medium used for cooling to flow through heat medium path 100 formed in support frame member 73. It is thus possible to prevent the thermally adverse influence on semiconductor wafer W.

Specifically, as shown in FIG. 6, the heat medium for cooling that is supplied from medium inlet 104 into ring-shaped path 100A of ring-shaped peripheral frame 73A branches to the right and left to flow through ring-shaped path 100A in directions opposite to each other. A part of the heat medium flows on the way into cross-shaped paths 100B and 100C formed in internal frames 73B and 73C to reach confluence space 102 of connection part 94. The heat medium further flows into ring-shaped paths 100D and 100E, thereafter meets the heat medium flowing in ring-shaped path 100A of ring-shaped peripheral frame 73A, and discharged directly from medium outlet 106. The discharged heat medium has its temperature appropriately controlled by heat medium temperature control means 112 and then supplied again from medium inlet 104 and circulated for use.

As explained above, the heat medium for cooling that flows through ring-shaped path 100A as well as cross-shaped paths 100B–100E makes it possible to cool support frame member 73, namely ring-shaped peripheral frame 73A and cross-shaped internal frames 73B–73E as well as each of sections 72A–72D of insulating plate 72 supported by support frame member 73.

In this case, with an increase of the number of processed wafers, the temperature of insulating plate 72 tends to gradually increase. Then, the temperature of heat medium is gradually lowered or the flow rate thereof is gradually increased in order to gradually enhance the cooling power. In this way, the temperature of heat medium is controlled by heat medium temperature control means 112 so that insulating plate 72 is always kept at substantially the same temperature during process, for example, always kept at approximately 80° C. Here, the temperature depends on a process temperature.

The temperature of insulating plate 72 can thus be maintained at a substantially constant temperature during a period in which a plurality of wafers are processed. As a result, the repeatability of a plasma process for wafers can remarkably be improved and the planar uniformity of the plasma process for wafers can also be improved. In this case, cooling wafer, fluorinert, chiller and the like can be used as the heat medium.

According to this embodiment, confluence space 102 is provided at the central part of the insulating plate where the heat radiation efficiency is lowest and thus the temperature tends to be highest, in order to allow most of the heat medium to flow into and concentrate in confluence space 102 and accordingly enhance the cooling efficiency of the central part. Therefore, the particular heating of the central part of the insulating plate can be prevented and accordingly the planar uniformity of the wafer temperature can further be enhanced.

Moreover, according to this embodiment, the cooling efficiency of insulating plate 72 can further be enhanced by using aluminum nitride as the material constituting insulating plate 72 that has a relatively high thermal conductivity.

As shown in FIG. 7, microwave radiation holes 90 of planar antenna member 76 are displaced from support frame member 73 so that radiation holes 90 do not match in position with support frame member 73. Therefore, the microwave radiated from microwave radiation holes 90 is not absorbed by support frame member 73 made of aluminum and accordingly the efficiency of use of the microwave can be improved.

Apparently, although the efficiency of use of the microwave slightly deteriorates, microwave radiation holes 90 and support frame member 73 may partially match in position.

When the conventional apparatus in which no cooling is performed for the insulating plate is actually used, the insulating plate is gradually heated to reach a temperature of approximately 300° C. On the other hand, when the apparatus of the present invention is used in which cooling is effected, the temperature of insulating plate 72 can be maintained at a constant temperature of approximately 80° C.

When cleaning is done for removing any unnecessary film attached to the internal wall for example of process chamber 32 by means of a cleaning gas, ClF$_3$ for example, the cleaning efficiency can be enhanced by heating insulating plate 72. Then, a heat medium for heating is allowed to flow. In actual, the temperature of the heat medium may be increased to be higher than that for the process as discussed above. Alternatively, the heat medium for cooling may be changed to any heat medium for heating.

In this way, the heat medium for heating is flown at the time of cleaning so that insulating plate 72 is heated to and maintained at a temperature of approximately 120° C. and thus the cleaning efficiency can be improved.

Figure 8A:
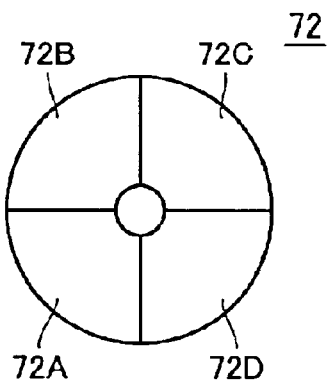
FIGS. 8A–8E show insulating plates divided respectively in various manners.
Figure 8B:
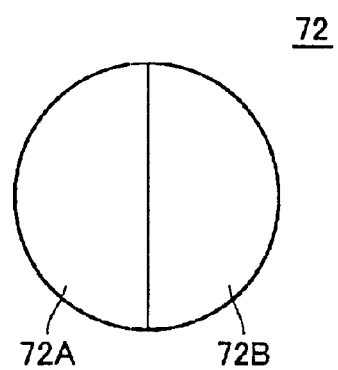
Figure 8C:
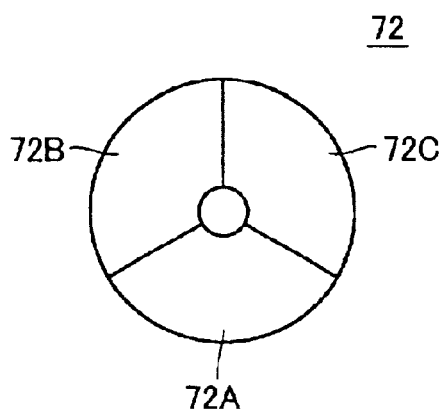
Figure 8D:
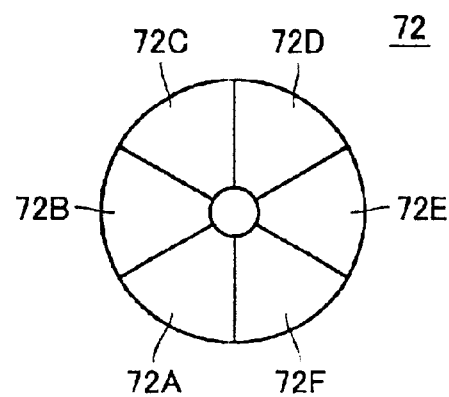
Figure 8E:
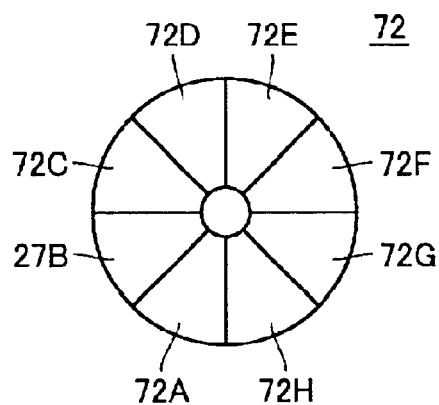
Figure 9:
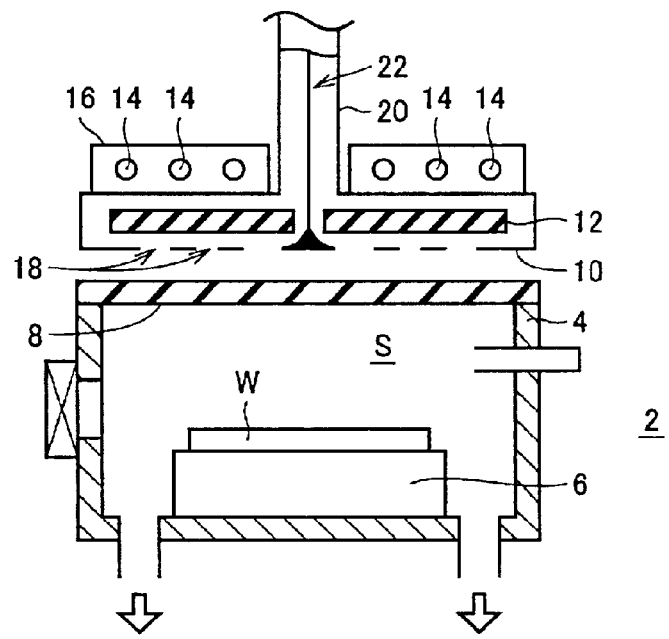
FIG. 9 diagrammatically shows a cross section of a conventional and general plasma processing apparatus.
Figure 10:
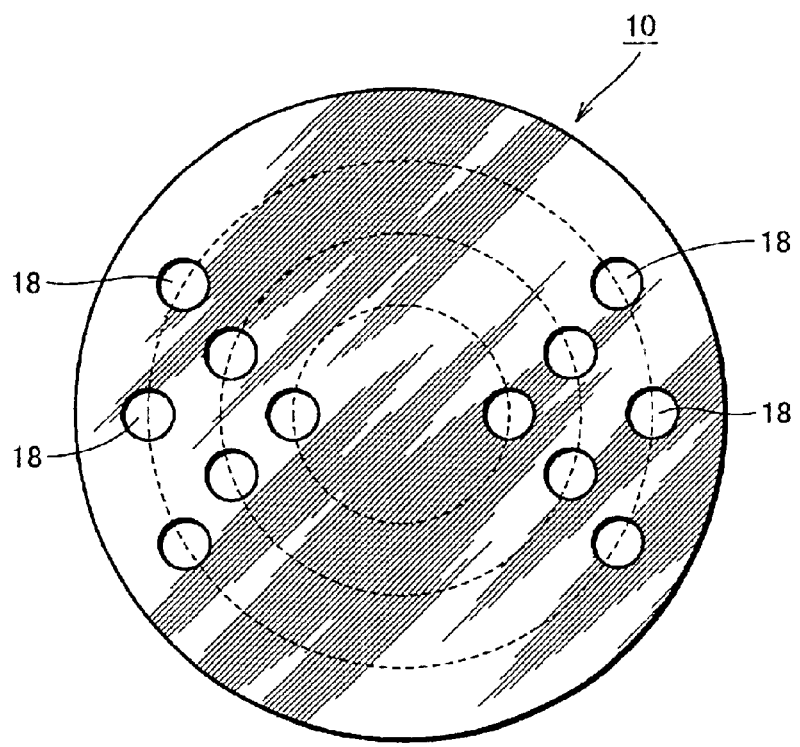
FIG. 10 is a plan view of a planar antenna member.

FIGS. 8A–8E show insulating plates 72 divided in various manners respectively. According to this embodiment, insulating plate 72 is divided into four sections 72A–72D as shown in FIG. 8A and the description thereof is presented above accordingly. The number of sections produced by dividing insulating plate 72 or the manner of dividing insulating plate 72 is not particularly limited. For example, insulating plate 72 may be divided into two sections 72A and 72B as shown in FIG. 8B, into three sections 72A–72C as shown in FIG. 8C, into six sections 72A–72F as shown in FIG. 8D, or into eight sections 72A–72H as shown in FIG. 8E.

As the number of sections produced by dividing the insulating plate increases, the cooling efficiency for the insulating plate can be made higher in process, or the heating efficiency for the insulating plate can be made higher in cleaning.

The description above of the embodiment of the present invention is applied to the film deposition on a semiconductor wafer. However, the embodiment is not limited thereto and applicable to other plasma processes such as plasma etching and plasma ashing.

In addition, the workpiece to be processed is not limited to the semiconductor wafer, and glass substrate, LCD substrate and the like may be employed as a workpiece.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing apparatus comprising:
    a process chamber including an open ceiling and an internal space which can be evacuated;
    an insulating plate divided into a plurality of regions and airtightly attached to the ceiling of said process chamber;
    a mount base placed in said process chamber for mounting thereon a workpiece to be processed;
    a planar antenna member placed above said insulating plate and including a microwave radiation hole for transmitting therethrough microwave used for generating plasma, said microwave transmitted through said insulating plate into said process chamber;
    gas supply means for supplying a predetermined gas into said process chamber;
    a heat medium path for flowing a heat medium along a line by which said insulating plate is divided into a plurality of regions; and
    heat medium temperature control means for controlling the temperature of said heat medium.

2. The plasma processing apparatus according to claim 1, further comprising a ring-shaped heat medium path for flowing the heat medium along a peripheral part of said insulating plate.

3. The plasma processing apparatus according to claim 2, wherein said ring-shaped heat medium path and the microwave radiation holes of said planar antenna member are displaced from each other with respect to the direction in which the microwave is transmitted.

4. The plasma processing apparatus according to claim 2, further comprising a support frame member supporting said insulating plate divided into a plurality of regions,
    wherein said support frame member includes said heat medium path and said ring-shaped heat medium path.

5. A The plasma processing apparatus according to claim 1, wherein said heat medium temperature control means controls the temperature of said heat medium to render the temperature of said insulating plate substantially constant in a normal process.

6. The plasma processing apparatus according to claim 1, wherein said heat medium temperature control means controls the temperature of said heat medium to heat said insulating plate to at least a predetermined temperature in cleaning.

7. The plasma processing apparatus according to claim 1, wherein said insulating plate is formed of a material selected from the group consisting of aluminum nitride, alumina and quartz.

8. The plasma processing apparatus according to claim 1, wherein said insulating plate is divided substantially radially from a central part of said insulating plate.

9. The plasma processing apparatus according to claim 1, wherein said heat medium path and the microwave radiation holes of said planar antenna member are displaced from each other with respect to the direction in which the microwave is transmitted.

10. The plasma processing apparatus according to claim 1, further comprising a support frame member supporting said insulating plate divided into a plurality of regions,
    wherein said support frame member includes said heat medium path.

11. The plasma processing apparatus according to claim 10, wherein said support frame member and the microwave radiation holes of said planar antenna member are displaced from each other with respect to the direction in which the microwave is transmitted.

12. The plasma processing apparatus according to claim 10, further comprising:
    first sealing means for airtightly sealing between said insulating plate and said support frame member; and
    second sealing means for airtightly sealing between said support frame member and said process chamber.

13. A plasma processing apparatus comprising:
    a process chamber including an open ceiling and an internal space which can be evacuated;
    an insulating plate divided into a plurality of regions and airtightly attached to the ceiling of said process chamber;
    a mount base placed in said process chamber for mounting thereon a workpiece to be processed;

a planar antenna member placed above said insulating plate and including a plurality of microwave radiation holes for transmitting therethrough microwave used for generating plasma, said microwave transmitted through said insulating plate into said process chamber;

gas supply means for supplying a predetermined gas into said process chamber; and a support frame member supporting said insulating plate divided into a plurality of regions and including a heat medium path for flowing a heat medium along a line by which said insulating plate is divided into a plurality of regions and along a peripheral part of said insulating plate.

14. The plasma processing apparatus according to claim 13, wherein said support frame member and the microwave radiation holes of said planar antenna member are displaced from each other with respect to the direction in which the microwave is transmitted.

* * * * *

UNITED STATES PATENT AND TRADEMARK OFFICE
CERTIFICATE OF CORRECTION

PATENT NO. : 6,729,261 B2 Page 1 of 1
DATED : May 4, 2004
INVENTOR(S) : Toshiaki Hongo It is certified that error appears in the above-identified patent and that said Letters Patent is hereby corrected as shown below:

Column 10,
Line 17, before "The" delete "A".

Signed and Sealed this

Thirtieth Day of November, 2004

JON W. DUDAS
*Director of the United States Patent and Trademark Office*